United States Patent [19]

Otsuka

[11] Patent Number: 5,574,940
[45] Date of Patent: Nov. 12, 1996

[54] DATA PROCESSOR WITH QUICKER LATCH INPUT TIMING OF VALID DATA

[75] Inventor: Toshinori Otsuka, Ibaragi, Japan

[73] Assignee: Intel Corporation, Santa Clara, Calif.

[21] Appl. No.: 516,317

[22] Filed: Aug. 17, 1995

Related U.S. Application Data

[63] Continuation of Ser. No. 143,914, Oct. 27, 1993, Pat. No. 5,471,630.

[51] Int. Cl.$^6$ .................................................. G06F 11/00
[52] U.S. Cl. ................................. 395/800; 364/DIG. 1; 364/265; 364/266.3; 364/746.2
[58] Field of Search .................................. 395/800, 775, 395/500, 550; 371/23, 25.1, 30; 369/746.2; 365/189

[56] References Cited

U.S. PATENT DOCUMENTS

| | | | |
|---|---|---|---|
| Re. 33,739 | 11/1991 | Takashima et al. | 84/603 |
| 4,763,303 | 8/1988 | Flannagan | 365/189 |
| 4,809,227 | 2/1989 | Suzuki et al. | 365/168 |
| 5,051,911 | 9/1991 | Kimura et al. | 364/468 |
| 5,210,857 | 5/1993 | Takamura | 395/550 |
| 5,260,903 | 11/1993 | Suyama et al. | 365/189.05 |
| 5,321,847 | 6/1994 | Johnson, Jr. | 455/63 |
| 5,361,230 | 11/1994 | Ikeda et al. | 365/194 |
| 5,434,520 | 7/1995 | Yetter et al. | 326/93 |
| 5,469,420 | 11/1995 | Fujita et al. | 369/59 |
| 5,471,630 | 11/1995 | Otsuka | 395/800 |

*Primary Examiner*—Mehmet B. Geckil
*Attorney, Agent, or Firm*—Blakely, Sokoloff, Taylor & Zafman

[57] ABSTRACT

A data processing apparatus includes a first data holding circuit, a second data holding circuit, a signal processing circuit, and a control circuit. The first data holding circuit outputs a signal as three values data representing a first valid value having a first logic value, a second valid value having a second logic value, and an invalid value. The second data holding circuit holds the three values data from the first data holding circuit. The signal processing circuit receives the three values data from the second data holding circuit and outputs a first ready signal indicating completion of data processing. The control circuit controls the second data holding circuit to hold the three values data from the first data holding circuit, and also outputs a second signal indicating completion of data processing in the second data holding circuit to the first data holding circuit when the three values data from the first data holding circuit exhibits one of the first and second valid values and the first ready signal is input from the signal processing circuit.

9 Claims, 10 Drawing Sheets

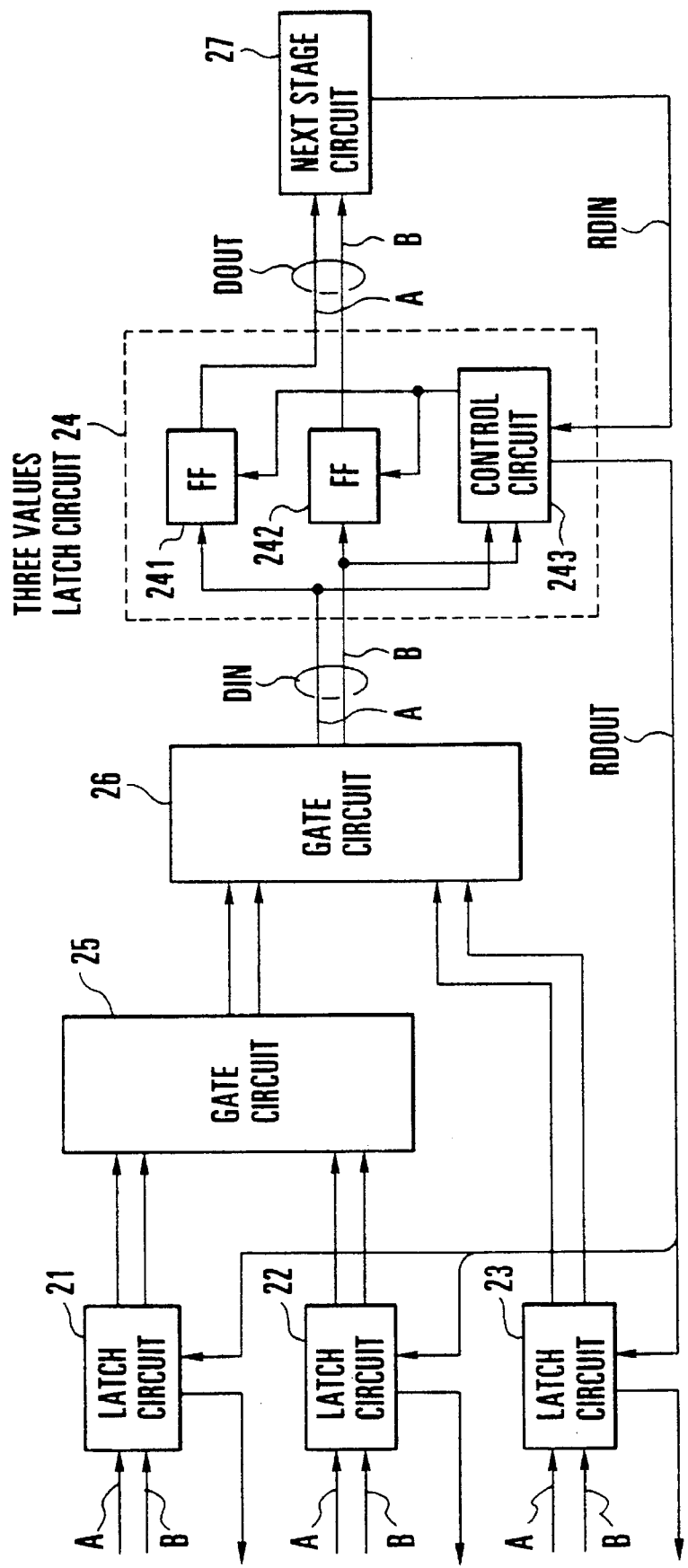
F I G. 5

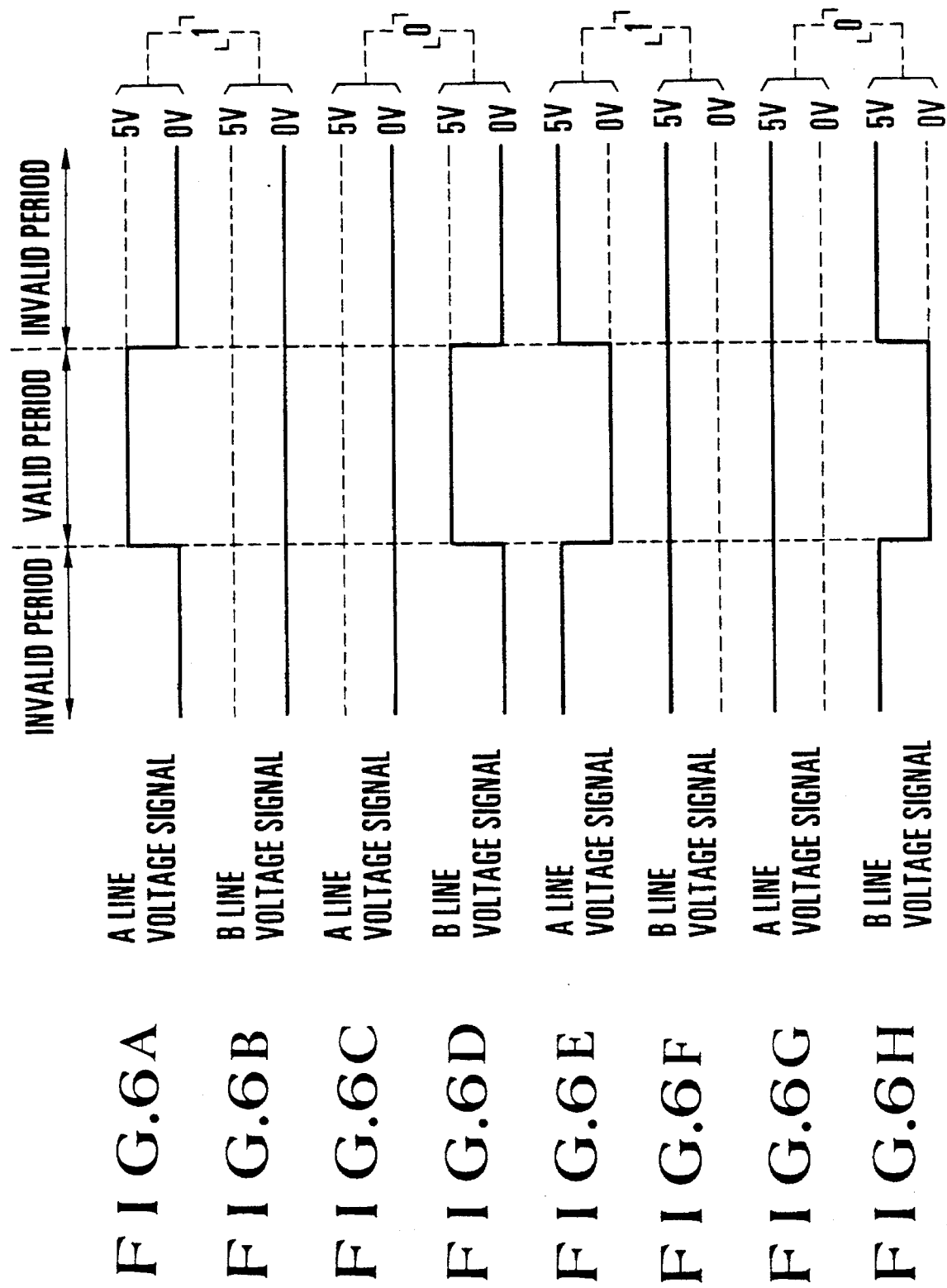

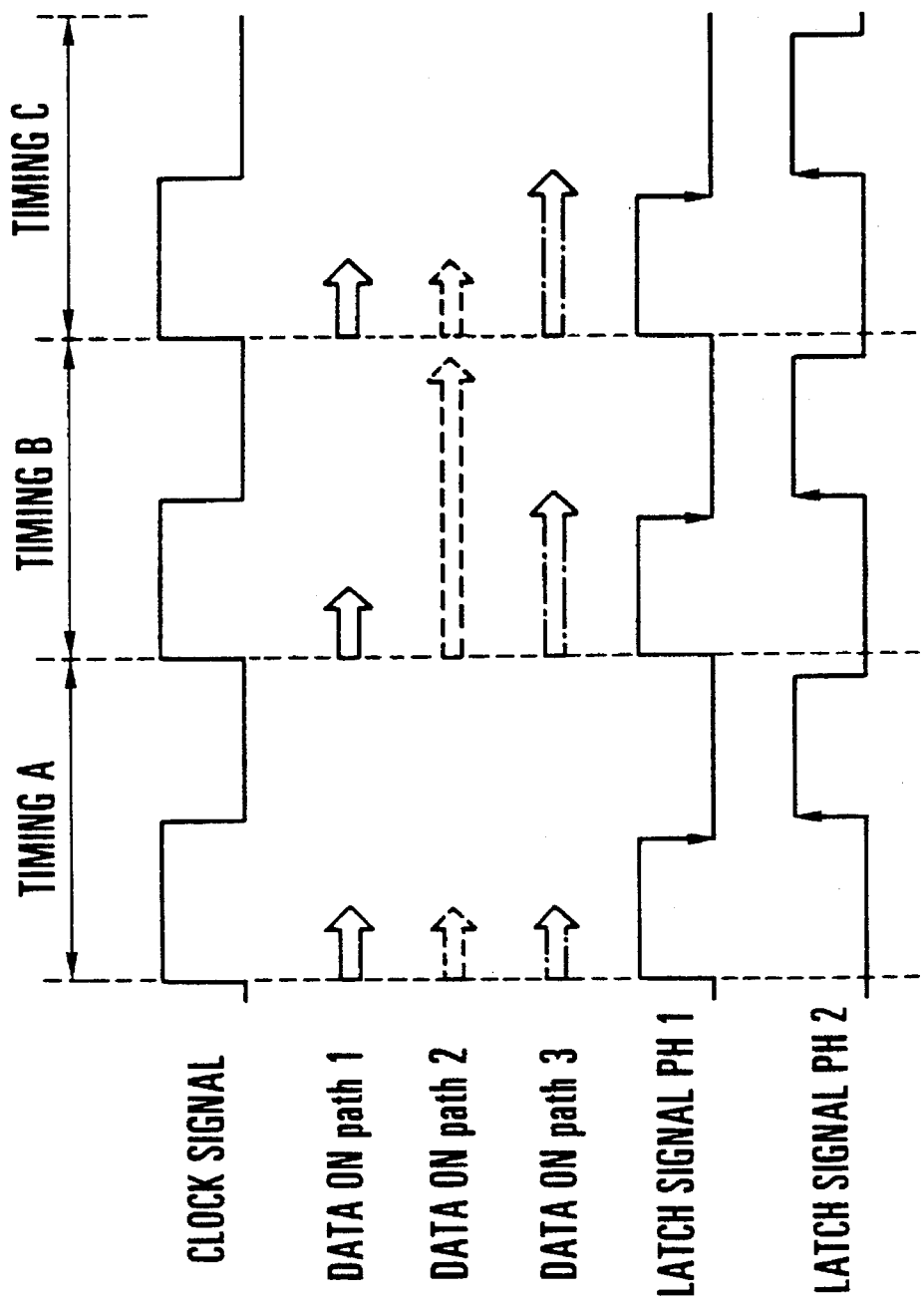

DATA PROCESSOR WITH QUICKER LATCH INPUT TIMING OF VALID DATA

This is a continuation of application Ser. No. 08/143,914, filed Oct. 27, 1993 now U.S. Pat. No. 5,471,630.

BACKGROUND OF THE INVENTION

The present invention relates to a data processing apparatus for processing data.

FIG. 9 shows part of a conventional data processing apparatus of this type. Referring to FIG. 9, reference numerals 1 to 4 denote latch circuits; and 5 and 6, gate circuits. Reference symbols PH1 and PH2 denote latch signals. In addition, a path1 indicated by the solid lines, a path2 indicated by the broken lines, and a path3 indicated by the alternate long and short dashed lines are transfer paths for data.

FIGS. 10A to 10F show the delayed states of data transferred on the respective transfer paths, i.e., the path1 to path3 and the timings of the latch signals PH1 and PH2 for latching the, respective data. In this case, the latch signals PH1 and PH2 are output at timings A to C in synchronism with the clock signal shown in FIG. 10A.

In general, data transferred on the path1 to the path3 normally exhibit substantially uniform short transfer delays, as indicated by the timing A in FIGS. 10A to 10D, so that valid data can be obtained by the latch signal PH1 in FIG. 10E, which is synchronized with the clock signal in FIG. 10A, in a short period of time. Assume that an add operation is performed by a circuit connected to the path2, resulting in carry processing or the like. In this case, as indicated by the timing B in FIG. 10C, it takes a long period of time to output valid data. At this time, even if the latch signal PH2 shown in FIG. 10F is output to the latch circuit 4, the valid data on the path2 is not yet input to the latch circuit 4 through the gate circuits 5 and 6. Therefore, the latch circuit 4 cannot latch the valid data.

For this reason, in the conventional data processing apparatus, the output timing of the latch signal PH2, which is output in synchronism with the clock signal, is determined in consideration of the longest period of time required to validate data. In this case, since the time required to validate data is prolonged when the power supply voltage of the circuit is low or the ambient temperature is high, the output timing of the latch signal, i.e., the clock signal rate, is determined in consideration of such worst conditions as well.

In the conventional data processing apparatus, since the clock rate is determined in consideration of the longest period of time required to validate data, data is always loaded to be processed after this longest period of time even if the data is immediately validated. Therefore, the processing speed is unnecessarily suppressed to be low.

SUMMARY OF THE INVENTION

It is an object of the present invention to improve the overall processing efficiency of a data processing apparatus by quickening the latch input timing of valid data.

In order to achieve the above object, according to the present invention, there is provided a data processing apparatus comprising first data holding means for outputting a signal as three values data representing a first valid value having a first logic value, a second valid value having a second logic value, and an invalid value, second data holding means for holding the three values data from the first data holding means, signal processing means for receiving the three values data from the second data holding means and outputting a first ready signal indicating completion of data processing, and control means for controlling the second data holding means to hold the three values data from the first data holding means, and also outputting a second signal indicating completion of data processing in the second data holding means to the first data holding means when the three values data from the first data holding means exhibits one of the first and second valid values and the first ready signal is input from the signal processing means.

BRIEF DESCRIPTION OF THE DRAWINGS

FIG. 5 is a block diagram showing a data processing apparatus according to another embodiment of the present invention;

FIGS. 6A to 6 are timing charts showing the three values state of data with two lines in the apparatus in FIG. 5;

FIGS. 10A to 10F are timing charts showing the transferred states of data in the conventional apparatus.

DESCRIPTION OF THE PREFERRED EMBODIMENTS

The present invention will be described below with reference to the accompanying drawings.

Figure 1:
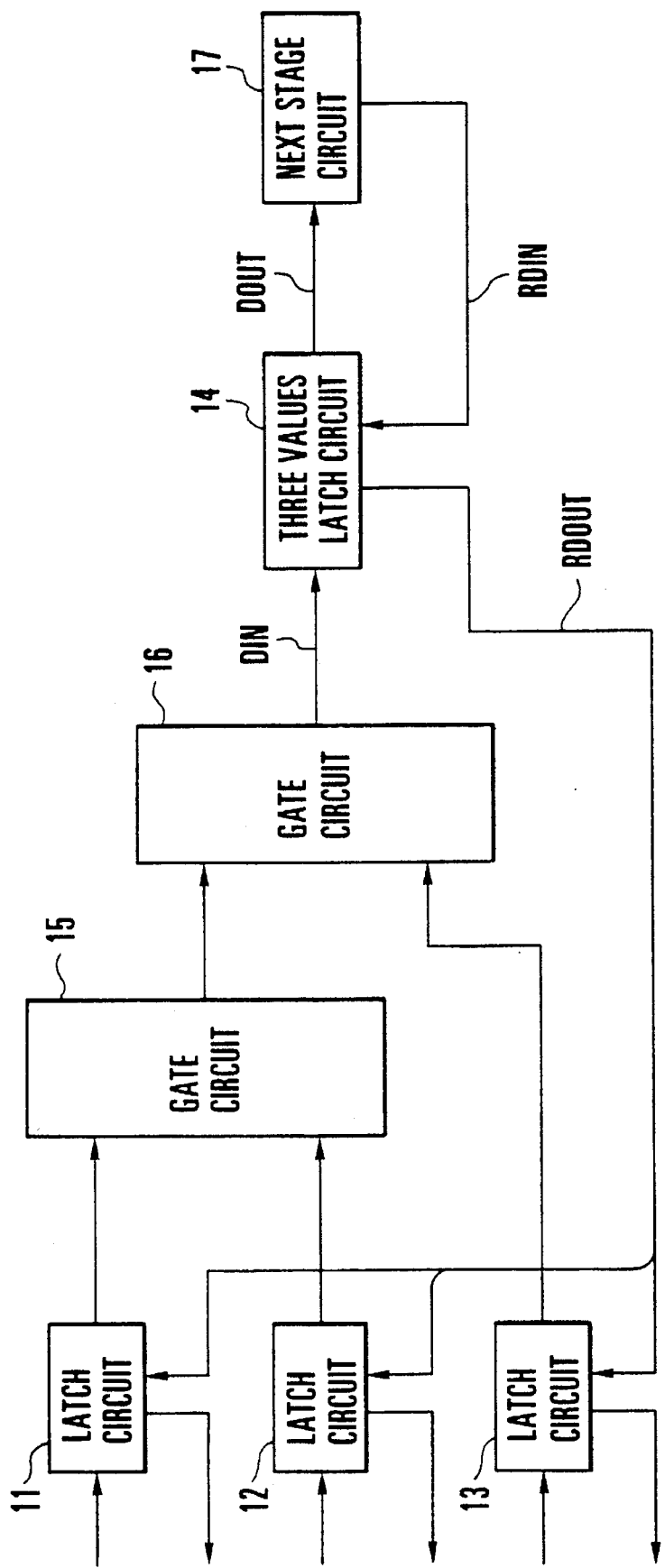
FIG. 1 is a block diagram showing a data processing apparatus according to an embodiment of the present invention.

FIG. 1 shows a data processing apparatus according to an embodiment of the present invention. As will be described later, in this apparatus, a voltage signal having three levels respectively indicating an invalid value, a valid value "1", and a valid value "0" is defined as a three values signal. When a valid value "0" is supplied to a latch circuit, the valid value "0" is not latched on the basis of a clock signal but is loaded by the next stage circuit upon confirming that the next stage circuit is in a ready state.

Referring to FIG. 1, reference numerals 11 to 13 denote latch circuits for-respectively latching input data at a pre-determined timing; 14, a three values latch circuit having a latch timing control function; 15, a two-input gate circuit for receiving outputs from the latch circuits 11 and 12; 16, a two-input gate circuit for receiving outputs from the latch circuit 14 and the gate circuit 15; and 17, a next stage circuit for receiving an output from the latch circuit 14. Reference symbol DIN denotes input data output from the gate circuit 16 and loaded into the latch circuit 14; DOUT, output data output from the latch circuit 14 to the next stage circuit 17; RDOUT, a ready output signal which is output from the latch circuit 14 to inform the latch circuits 11 to 13 on the previous stage whether valid data (to be described later) is input or not; and RDIN, a ready input signal which is output from a latch circuit (not shown) on the output stage in the next stage circuit 17 to inform the latch circuit 14 whether valid data is input to the latch circuit (not shown) of the next stage circuit 17. Both the ready output signal RDOUT and the ready input signal RDIN indicate a ready state indicating that a signal can be input, i.e., indicating that immediately preceding data has been processed, with 0 V; an unready state indicating that a signal cannot be input, i.e., indicating that immediately preceding data is being processed, with 5 V.

Figure 2:
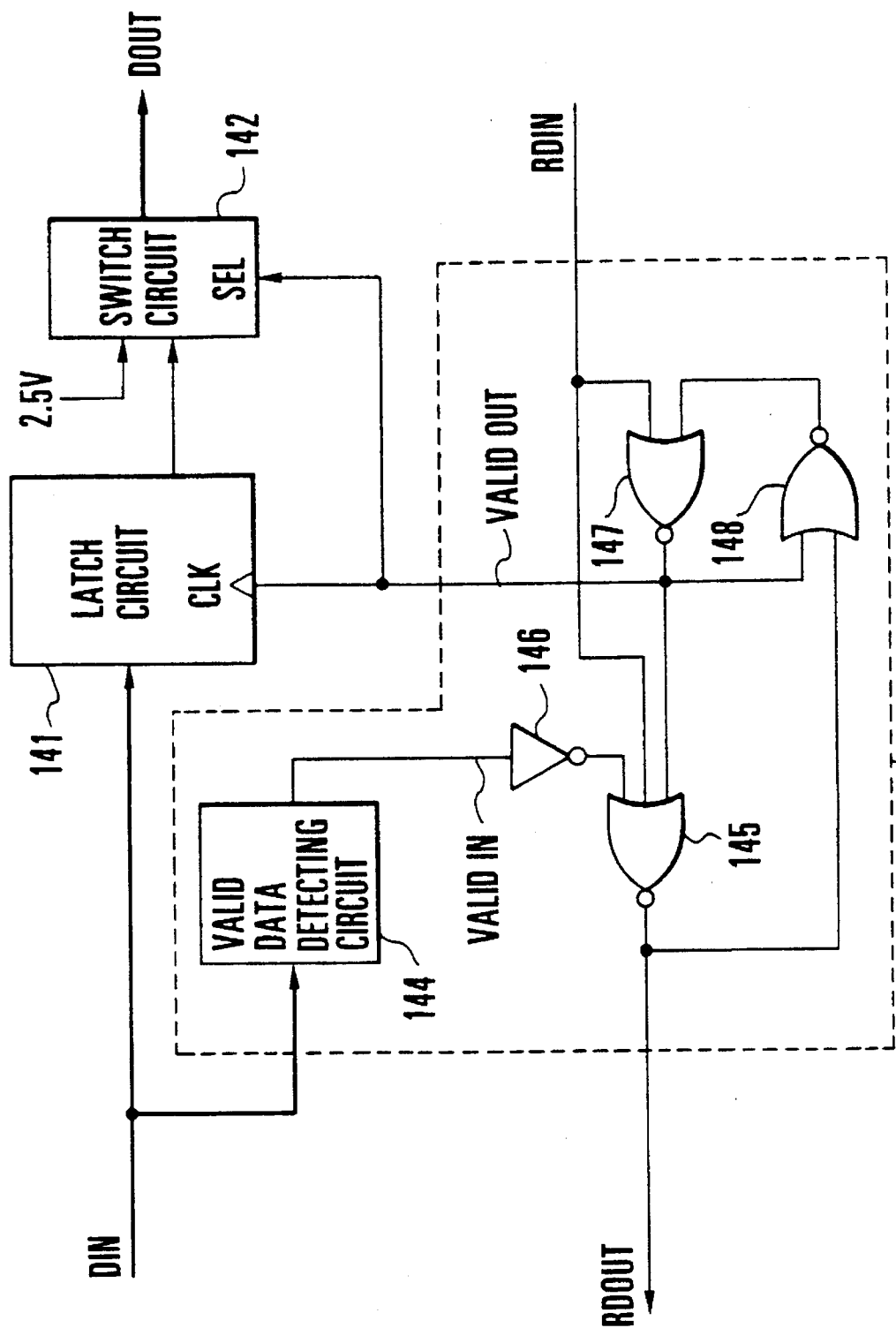
FIG. 2 is a block diagram showing an example of the three vales latch circuit shown in FIG. 1.

FIG. 2 shows an example of the three values latch circuit in FIG. 1. Referring to FIG. 2, reference numeral 141 denotes a latch circuit for latching two values, i.e., 0-V and 5-V values, of three values input data DIN having 0-V, 2.5-V, and 5-V values at the leading edge of a clock input to a clock terminal CLK; 142, a switch circuit for selecting a voltage of 2.5 V and an output from the latch circuit 141 on the basis of the logic of a selection signal input to a select terminal SEL and outputting three values output data DOUT; and 143, a control circuit for receiving the input data DIN and the ready input signal RDIN to output a valid output VALID OUT as a latch timing signal to the clock terminal CLK of the latch circuit 141 and as a selection signal to the select terminal SEL of the switch circuit 142, and outputting the ready output signal RDOUT. The control circuit 143 is constituted by a valid data detecting circuit 144 for receiving the three values input data DIN and outputting a valid input VALID IN when the input data DIN is at 0 V or 5 V, a three-input NOR gate 145, an inverter 146, and NOR gates 147 and 148.

Figure 3:
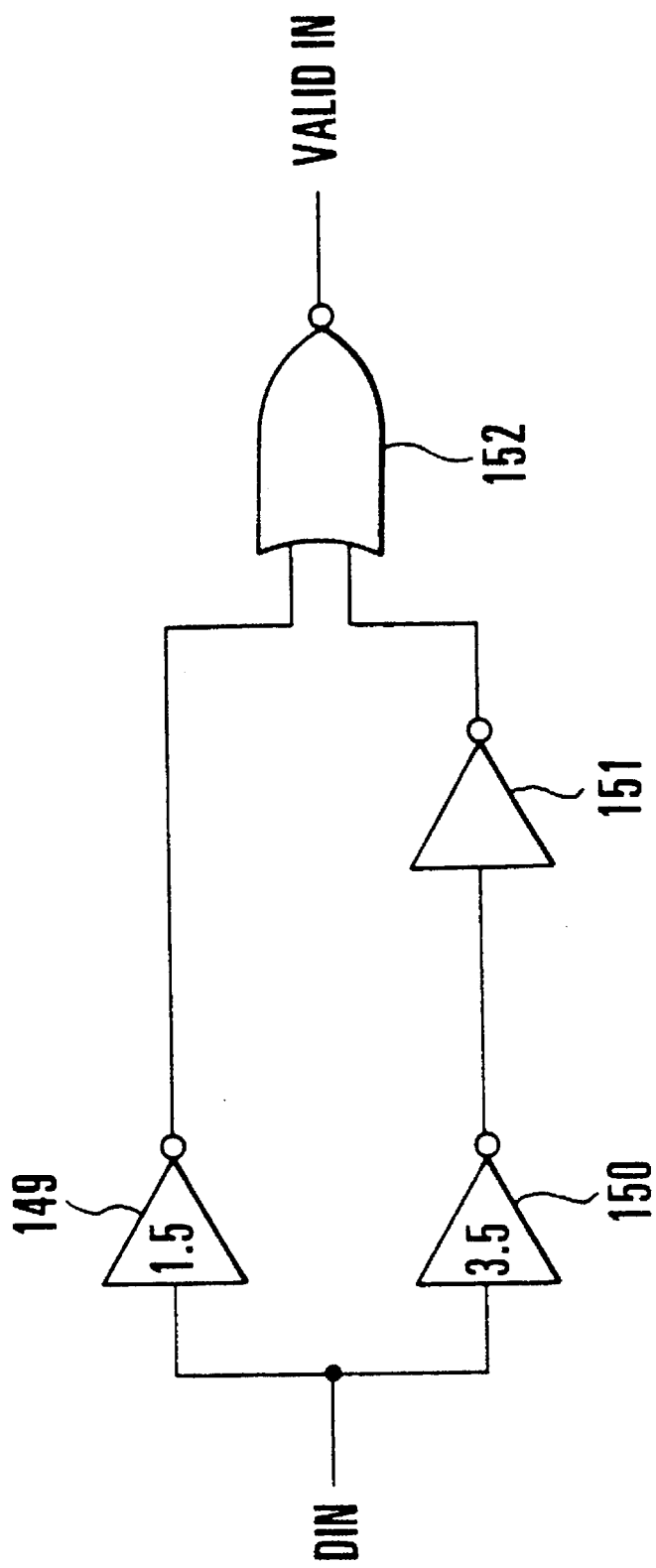
FIG. 3 is a circuit diagram showing an example of the valid data detecting circuit 144 shown in FIG. 2.

FIG. 3 shows an example of the valid data detecting circuit 144 in FIG. 2. Referring to FIG. 3, reference numeral 149 denotes an inverter having a threshold voltage of 1.5 V; 150, an inverter having a threshold voltage of 3.5 V; 151, an inverter for inverting an output from the inverter 150; and 152, an OR gate for receiving two outputs from the inverters 149 and 151. In this circuit, when the input data DIN is at 2.5 V, the outputs of the inverters 149, 150, and 151 are respectively set at 0 V, 5 V, and 0 V. As a result, the output of the OR gate 152 is set at 0 V. When the input data DIN is at 0 V or 5 V, one input of the OR gate 152 is set at 0 V, while the other input is set at 5 V. As a result, a 5-V valid value is output.

FIGS. 4A to 4D show the timings of various signals input/output from/to the latch circuit 14. The operation of the apparatus of the embodiment will be described below with reference to the timing charts in FIGS. 4A to 4D.

Figure 4:
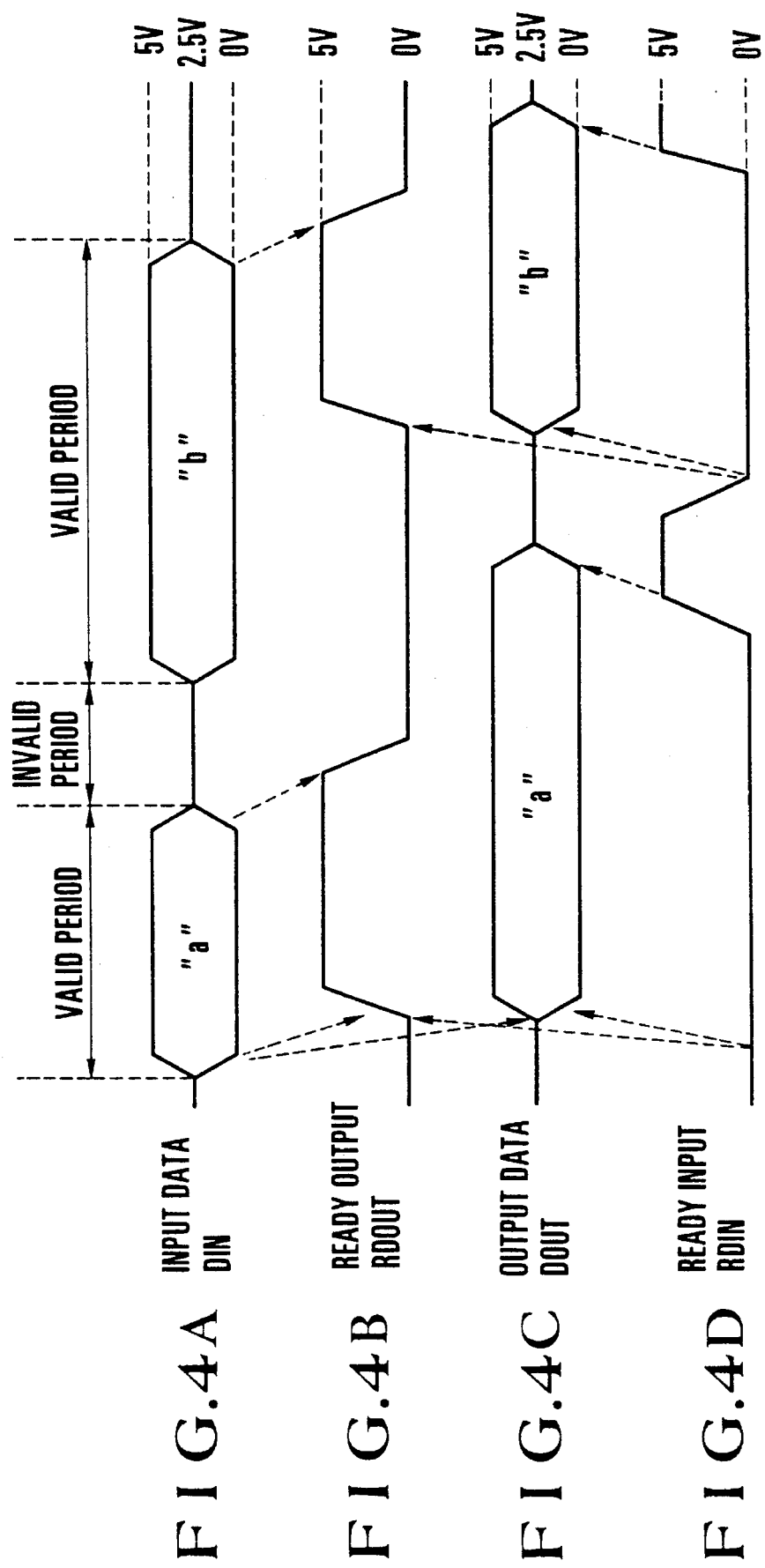
FIGS. 4A to 4D are timing charts showing the input/output stapes of data in the apparatus in FIG. 1.

In this case, the input data DIN and the output data DOUT are expressed as three values data. More specifically, as shown in FIGS. 4A and 4C, the voltages of these data signals are sorted into three levels, i.e., 0 V, 2.5 V, and 5 V. A signal exhibiting a voltage level of 2.5 V during an invalid period is defined as an invalid value, whereas a signal exhibiting 0 V or 5 V during a valid period is defined as a valid value. Of the valid values, a signal exhibiting a voltage of 5 V is defined as a valid value "1" (a valid value having a first logic value), and a signal exhibiting a voltage of 0 V is defined as a valid value "0" (a valid value having a second logic value). In this manner, the input data DIN and the output data DOUT are expressed as three values, i.e., an invalid value corresponding to a voltage of 2.5 V, a valid value "0" corresponding to a voltage of 0 V, and a valid value "1" corresponding to a voltage of 5 V.

Assume that valid data "a" arrives, as the input data DIN, at the latch circuit 14, as shown in FIG. 4A. In this case, as shown in FIG. 4D, when the ready input signal RDIN output from the next stage circuit 17 is at 0 V, the latch circuit 14 confirms that the next stage circuit 17 is in a ready state. After this confirmation, as shown in FIG. 4B, by setting the ready output signal RDOUT at 5 V, the latch circuit 14 informs the latch circuits 11 to 13 on the previous stage that the latch circuit 14 itself is in an unready state. In addition, as shown in FIG. 4C, the latch circuit 14 receives the valid data "a" and outputs the output data DOUT, as data "a", to the next stage circuit 17.

This operation will be described with reference to FIG. 2. When data input to the valid data detecting circuit 144 is valid data, the output of the inverter 146 is set at L level. When the ready input signal RDIN is at L level indicating a ready state, the output of the NOR gate 145 is set at H level to output a ready signal. Since the output of the NOR gate 145 is at H level, the output of the NOR gate 148 is set at L level, and the output of the NOR gate 147 is set at H level. As a result, the valid output VALID OUT is supplied to the latch circuit 141 and the switch circuit 142. With this operation, the latch circuit 141 latches the valid value of the input data DIN, i.e., a 0-V or 5-V value. The switch circuit 142 selects the latched output from the latch circuit 141 in accordance with the H-level valid output VALID OUT, and outputs the data output DOUT.

When input of the input data DIN is completed, the latch circuit 14 sets the ready output signal RDOUT at 0 V to inform the latch circuits 11 to 13 on the previous stage that the latch circuit 14 itself is in a ready state, as shown in FIG. 4B. Upon completion of input of the input data DIN, an invalid period is set, and the input data DIN exhibits an invalid value. When valid data "b" arrives, as the input data DIN, at the latch circuit 14, since the output data "a" output from the latch circuit 14 is not input to the next stage circuit 17, the latch circuit 14 keeps outputting the data "a". In this case, therefore, the valid data "b" cannot be loaded.

Subsequently, the valid data "a" output from the latch circuit 14 is loaded into the next stage circuit 17, and the ready input signal RDIN output from the next stage circuit 17 is set at 5 V, i.e., the next stage circuit 17 is set in an unready state, as shown in FIG. 4D. At this time, as shown in FIG. 4C, the latch circuit 14 temporarily switches the output data DOUT from the valid data "a" to invalid data. When input of the valid data "a" in the next stage circuit 17 is completed, and the next stage circuit 17 is set in a ready state upon setting the ready input signal RDIN at 0 V, as shown in FIG. 4D, the latch circuit 14 sets the ready output signal RDOUT at 5 V, as shown in FIG. 4B. With this operation, the latch circuit 14 informs the latch circuits 11 to 13 on the previous stage that the latch circuit 14 itself is in an unready state. In addition, as shown in FIG. 4C, the latch circuit 14 starts to receive the valid data "b", and outputs it, as data "b", to the next stage circuit 17.

In this manner, input and output signals themselves are defined as three values signals representing an invalid value, a valid value "1", and a valid value "0". when valid data arrives at the latch circuit 14, the circuit loads the data upon checking the ready input signal RDIN indicating that the next stage circuit 17 is in a ready state, and outputs the ready output signal RDOUT indicating an unready state to the circuits on the previous stage. With this operation, valid data can be loaded and processed as soon as the next stage circuit 17 is set in a ready state, unlike the conventional apparatus in which data is loaded in response to a clock signal set in consideration of a data validation delay caused by a special operation of a previous circuit, a drop in the drive voltage of the circuit, the worst temperature condition, and the like.

Therefore, the data processing efficiency is greatly improved.

The data processing speed of the apparatus of the embodiment is 1.1 times that of the conventional apparatus in a case wherein a 10% drop in the drive voltage of the circuit is assumed; and 1.4 times that of the conventional apparatus in a case wherein the worst temperature condition is assumed. As a whole, the processing speed becomes two to four times that of the conventional apparatus.

FIG. 5 shows a data processing apparatus according to another embodiment of the present invention. FIGS. 6A to 6H show various signals in the data processing apparatus in FIG. 5. In this embodiment, three values signals as input and output signals in FIG. 1 are not defined by the voltage level of one signal line but are defined as combinations of binary signals from two lines, i.e., A and B lines.

Referring to FIG. 5, reference numerals 21 to 23 denote latch circuits, each designed to latch two input data from A and B lines at a predetermined timing and constituted by, e.g., two D-type flip-flops for independently latching inputs from the A and B lines; 24, a latch circuit having a latch timing control function; 25, a gate circuit for receiving two outputs from the latch circuits 21 and 22; 26, a gate circuit for receiving two outputs from the latch circuit 23 and the gate circuit 25; and 27, a next stage circuit for receiving two outputs from the latch circuit 24.

The latch circuit 24 is constituted by D-type flip-flops (to be referred to as FFs hereinafter) 241 and 242 for respectively latching input data output from the gate circuit 26 through the A and B lines, and a control circuit 243 for controlling the latch timings of the FFs 241 and 242 on the basis of input data DIN and a ready input signal RDIN, and outputting a ready output signal RDOUT.

In the data processing apparatus having the above-described arrangement, as shown in FIGS. 6A to 6D, the control circuit 243 of the latch circuit 24 determines an invalid value when both the voltage levels of the A and B lines are at low level in an invalid period, and determines a valid value when either of the voltage levels of the A and B lines is at high level in a valid period. In determining this valid value, a valid value "1" (FIGS. 6A and 6B) is determined when the voltage level of the A line is at high level, and a valid value "0" (FIGS. 6C and 6D) is determined when the voltage level of the B line is at high level.

Three values signals may be defined by signals obtained by inverting the voltage levels of the A and B lines. More specifically, the control circuit 243 of the latch circuit 24 determines an invalid value when both the voltage levels of the A and B lines are at high level, as indicated by the invalid periods in FIGS. 6E to 6H, and determines a valid value when either of the voltage levels of the A and B lines is set at low level, as indicated by the valid periods in FIGS. 6E to 6H. Of valid data, a valid value "1" (FIGS. 6E and 6F) is determined when the voltage level of the A line is at low level, and a valid value "0" (FIGS. 6G and 6H) is determined when the voltage level of the B line is at high level. Upon reception of the valid value "1" or "0" from the gate circuit 26, the control circuit 243 of the latch circuit 24 checks the ready input signal RDIN from the next stage circuit 27 and supplies read signals to the FFs 241 and 242 so as to latch the input data from the A and B lines.

FIGS. 7A to 7L show examples of the arrangements of two-input AND and OR gates, each for receiving two pairs of input signals, as first and second inputs, from the first A and B lines and the second A and B lines whose logic values are defined in the above-described manner. Such circuits are used for the gate circuits 25 and 26 shown in FIG. 5.

Figures 7A, 7B, 7C, 7D, 7E, 7F, 7G, 7H, 7I, 7J, 7K, 7L:
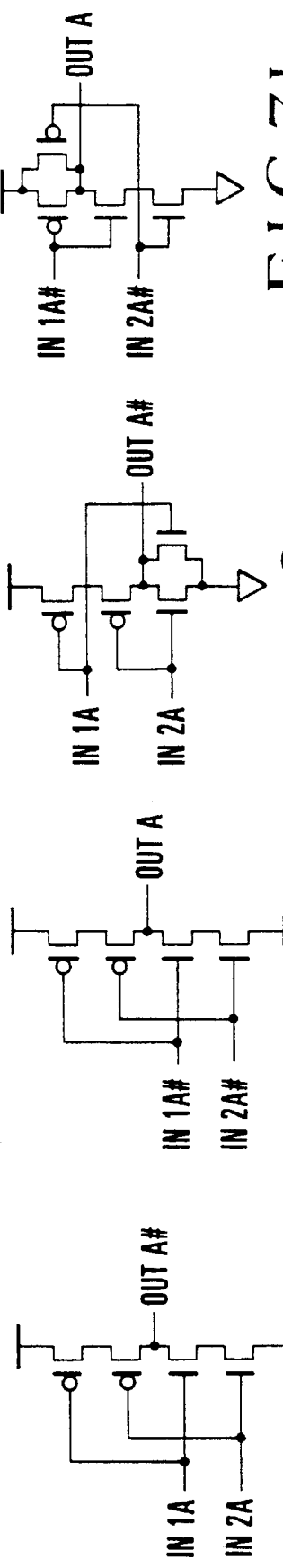
FIGS. 7A to 7L are circuit diagrams showing examples of the three values operation circuit used for the apparatus in FIG. 5.

More specifically, for example, the AND gate shown in FIG. 7C is constituted by the two circuit blocks shown in FIGS. 7A and 7B. In this case, a first input IN1 is constituted by inputs IN1A and IN1B from the first A and B lines, and a second input IN2 is constituted by inputs IN2A and IN2B from the second A and B lines. An A line inverted output (OUTA#) is obtained by the circuit shown in FIG. 7A on the basis of the inputs IN1A and IN2A, as binary signals, from the first and second A lines. A B line inverted output (OUTB#) is obtained by the circuit shown in FIG. 7B on the basis of the inputs IN1B and IN2B, as binary signals, from the first and second B lines. Consequently, if the logic values of the A and B lines are defined as shown in FIGS. 6A to 6D or 6E to 6H, the inverted output (OUT#) of the AND of the first and second inputs IN1 and IN2 shown in FIG. 7C is obtained when the first input IN1 constituted by the inputs IN1A and IN1B respectively from the first A and B lines and the second input IN2 constituted by the inputs IN2A and IN2B from the second A and B lines are input.

The operation of the AND gate for outputting the AND of the first and second inputs IN1 and IN2 will be described in detail below with reference to FIG. 8.

Figure 8:
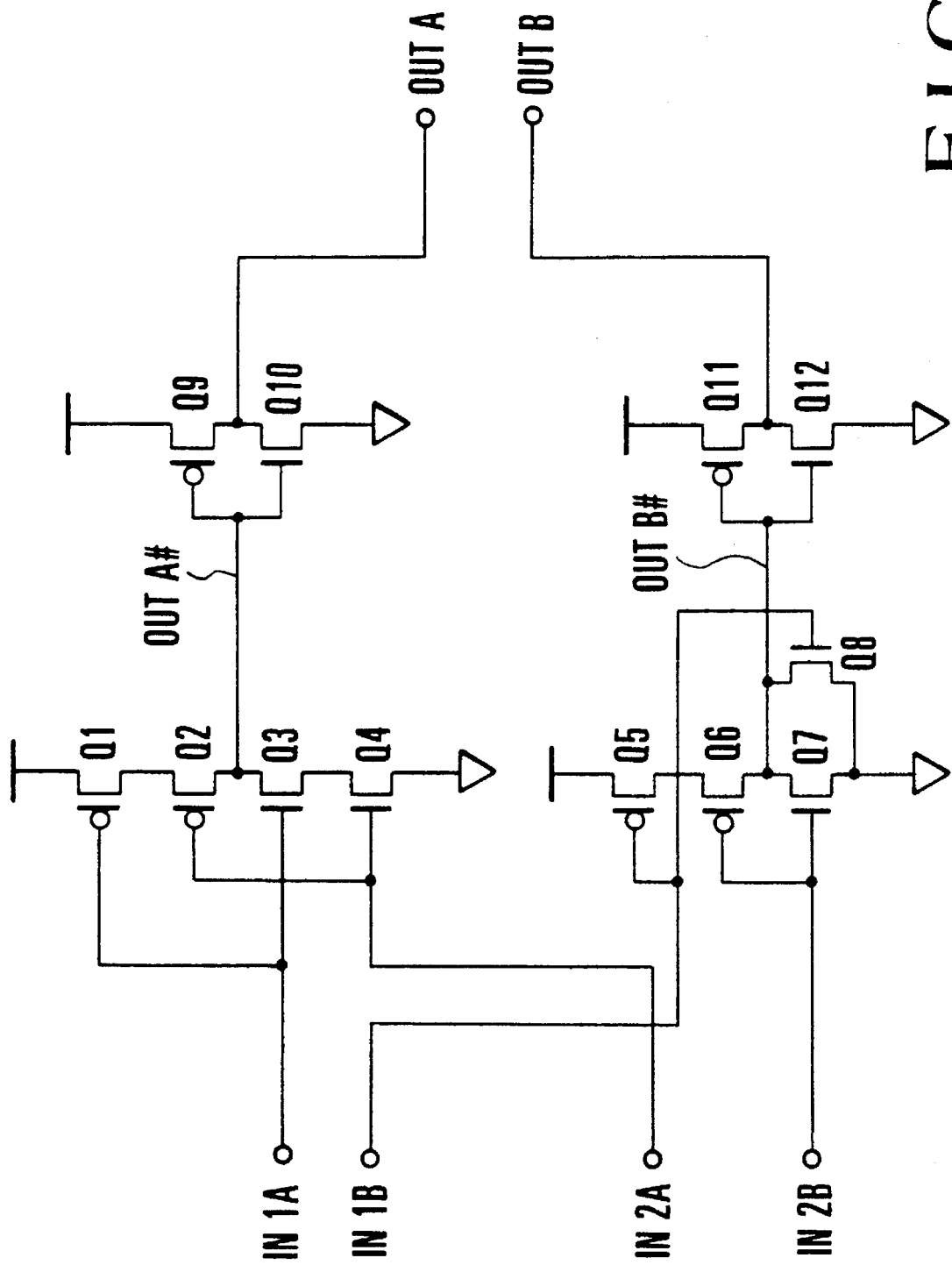
FIG. 8 is a circuit diagram showing an example of the three values AND operation circuit shown in FIG. 7C.
Figure 9:
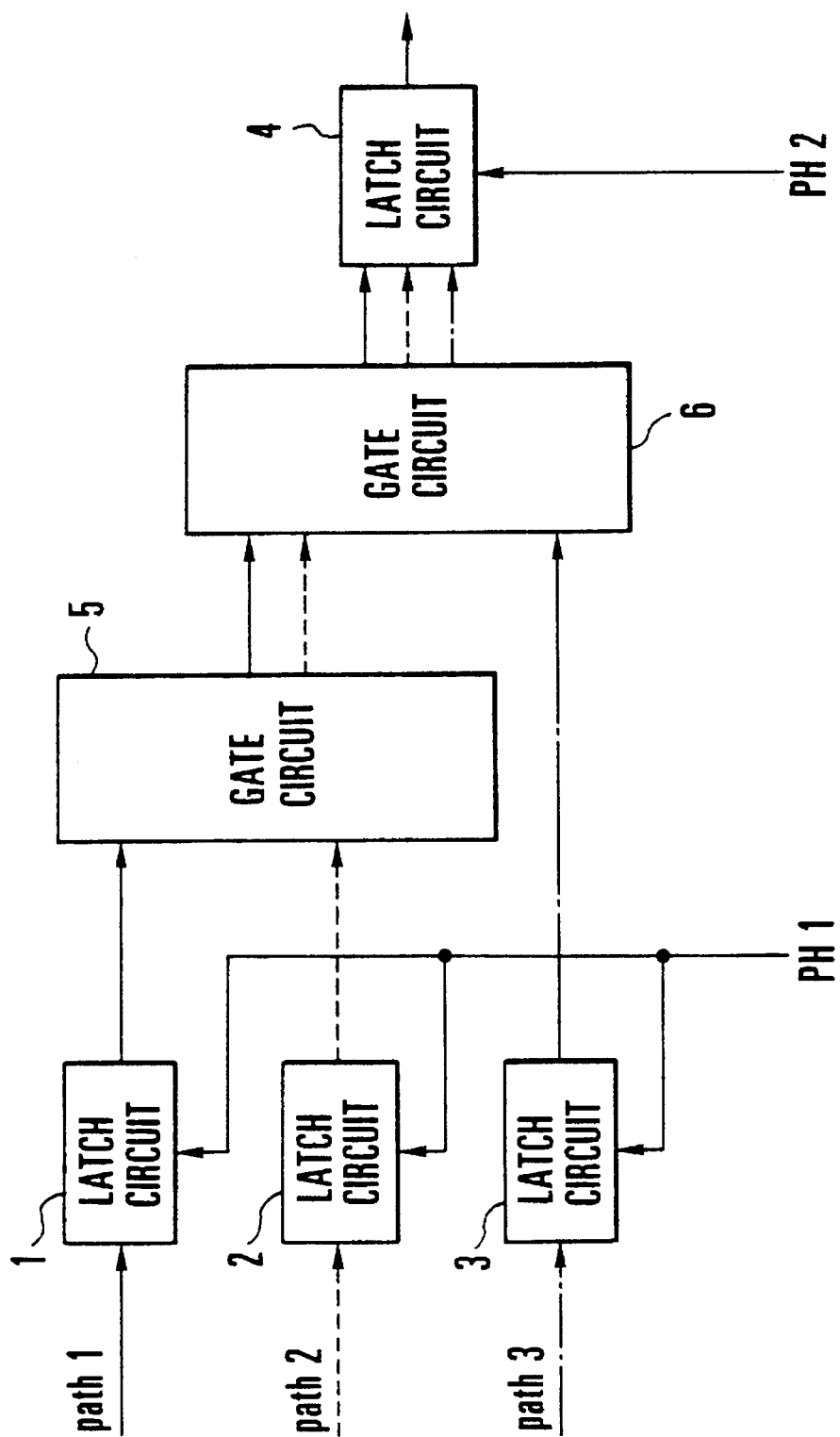
FIG. 9 is a block diagram showing a conventional data processing apparatus.

Referring to FIG. 8, the circuit constituted by transistors Q1 to Q4 has an arrangement equivalent to that of the circuit shown in FIG. 7A, and the circuit constituted by transistors Q5 to Q8 has an arrangement equivalent to that of the circuit shown in FIG. 7B. In this case, the circuit constituted by transistors Q9 and Q10 is an inverter for generating an inverted output OUTA of an output OUTA# from the circuit constituted by the transistors Q1 to Q4. The circuit constituted by transistors Q11 and Q12 is an inverter for generating an inverted output OUTB of an output OUTB# from the circuit constituted by the transistors Q5 to Q8.

Assume that the first and second inputs IN1 and IN2 are set to the invalid value according to the definition indicated by FIGS. 6A to 6D. That is, the inputs IN1A, IN1B, IN2A, and IN2B are all set to 0 V to define the invalid value. In this case, since the transistors Q1 and Q2 are turned on, and the transistors Q3 and Q4 are turned off, the output OUTA# of this circuit block is set at high level. As a result, the transistors Q9 and Q10 are turned off and on, respectively, to set the output OUTA at low level (0 V). Meanwhile, the transistors Q5 and Q6 are turned on, and the transistors Q7 and Q8 are turned off, thus setting the output OUTB# of this circuit block at high level. As a result, the transistors Q11 and Q12 are turned off and on, respectively, to set the output OUTB at low level. Therefore, if the invalid value is supplied as an input, the invalid value is output as an output from the overall circuit. Assume that this state is defined as "1".

When the first input IN1 is set to the valid value "1" (i.e., the inputs IN1A and IN1B are set at 5 V and 0 V, respectively) in the state "1", the state of the transistor Q1 is changed from an ON state to an OFF state, and the state of the transistor Q3 is changed from an OFF state to an ON state. However, since the transistors Q2 and Q4 are held in the previous states, the output OUTA# of this circuit block is at high level. Hence, the output OUTA is held at low level, and the output OUTB is at low level. Therefore, the invalid value is still output from the overall circuit. Furthermore, when the second input IN2 is set to the valid value "1" in the state "1", the output OUTB is also held at low level, while the output OUTA is at low level. In this case, therefore, invalid data is also output.

Assume that the first input IN1 is set to the valid value "0" (i.e., the inputs IN1A and IN1B are respectively set at 0 V and 5 V) in the state "1". In this case, the transistors Q5 and Q8 are turned off and on, respectively, and hence the output OUTB# of this circuit block is set at low level. Therefore, the transistors Q11 and Q12 are turned on and off, respectively, to set the output OUTB at high level. As a result, the valid value "0" is output as an output from the overall circuit. Furthermore, when the input IN2 is set to the valid value "0" in the state "1", the output OUTB is also set at high level, thus outputting the valid value "0" as an output from the overall circuit.

Assume that the first input IN1 is set to the valid value "1" (i.e., the inputs IN1A and IN1B are respectively set at 5 V and 0 V). In this case, the output OUTA# of the circuit constituted by the transistors Q1 to Q4 is set at high level. As a result, the output OUTA is set at low level. If the valid value "0" is supplied as the input IN2 at this time, the output OUTB# of the circuit constituted by the transistors Q5 to Q8 is set at low level. As a result, the output OUTB is set at high level, and the valid value "0" is output as an output from the overall circuit.

In contrast to this, when the first and second inputs IN1 and IN2 are respectively set to the valid value "0" and the valid value "1", the output OUTA is set at low level, and the output OUTB is set at high level. Therefore, the valid value "0" is output as an output from the overall circuit.

When both the first and second inputs IN1 and IN2 are to the valid value "1", the output OUTA# of the circuit constituted by the transistors Q1 to Q4 is set at low level, and the output OUTB# of the circuit constituted by the transistors Q5 to Q8 is set at high level. As a result, the outputs OUTA and OUTB are respectively set at high level and low level. Therefore, the valid value "1" is output as an output from the overall circuit.

In this manner, when two signals from a pair of A and B lines whose logic values are defined as shown in FIGS. 6A to 6D or 6E to 6H are used as one input, a two-input AND gate for outputting the AND of two inputs can be easily designed. In addition, an AND gate with more inputs can be designed in the same manner as described above.

Similarly, an AND gate such as the one shown in FIG. 7F, which has inverted voltage levels with respect to the circuit shown in FIG. 7C, can be constituted by the two circuit blocks shown in FIGS. 7D and 7E.

The OR gate shown in FIG. 7I can be constituted by the circuit blocks shown in FIGS. 7G and 7H. The OR gate shown in FIG. 7L, which has inverted voltage levels with respect to the OR gate in FIG. 7I, can also be constituted by the circuit blocks shown in FIGS. 7J and 7K.

In this manner, when the two lines, i.e., the A and B lines, are used, and the three values signals indicating an invalid value, a valid value "1", and a valid value "0" are defined by the voltage levels of the two lines, various types of gate circuits, e.g., AND and OR gates for respectively outputting the AND and OR of a plurality of inputs, with signals from the two lines, the A and B lines, being used as one input, can be easily designed.

As has been described above, according to the present invention, when a processing result output is validated on the basis of data from the first data holding circuit, the first ready signal from the next stage circuit connected to the second data holding circuit is detected, and the valid data is loaded into the second data holding circuit in accordance with the detection output. In addition, the second ready signal is supplied to the first data holding circuit to inform that the valid data has already been processed. With this operation, when output data is validated, the data can be immediately loaded to be supplied to the next stage circuit without waiting for the longest period of time set in consideration of the worst operating conditions of the circuit. Therefore, the data processing efficiency can be improved.

What is claimed is:

1. A data processing apparatus comprising:

first data holding means for outputting a signal as three values data representing a first valid value having a first logic value, a second valid value having a second logic value, and an invalid value;

second data holding means for holding the three values data from said first data holding means;

signal processing means for receiving the three values data from said second data holding means and outputting a first ready signal indicating completion of data processing; and control means for controlling independent of an external clock signal said second data holding means and for outputting to said first data holding means, independent of an external clock signal, a second signal indicating completion of data processing in said second data holding means when the three values data from said first data holding means exhibits one of the first and second valid values and the first ready signal is input from said signal processing means.

2. An apparatus according to claim 1, wherein said control means comprises valid data detecting means for detecting input of the first and second valid values from the three values data from said first data holding means.

3. An apparatus according to claim 1, wherein the three values data from said first data holding means is an analog signal whose voltage level changes to three values on one signal line.

4. An apparatus according to claim 3, wherein said second data holding means comprises a latch circuit for latching only binary data of the first and second valid values from said first data holding means, and a switch circuit for selectively outputting the binary data from said latch circuit and invalid data; and said control circuit comprises a valid data detecting circuit for detecting input of the first and second valid values from the three values data from said first data holding means, and a signal control circuit for outputting a latch signal, a selection signal for selecting an output from said latch circuit, and the second signal to said latch circuit, said switch circuit, and said first data holding means, respectively, on the basis of a valid data detection output from said valid data detecting circuit and the first ready signal from said signal processing means.

5. An apparatus according to claim 1, wherein the three values data from said first data holding means is a combination of digital data, each changing to two values on two signal lines.

6. An apparatus according to claim 5, wherein said second data holding means comprises a pair of flip-flops for respectively latching digital data on the two signal lines.

7. An apparatus according to claim 5, further comprising four-input/two-output gate means for receiving a plurality of three values data from said first data holding means and outputting one three values data to said second data holding means.

8. An apparatus according to claim 1, wherein said control means outputs a third signal to said first data holding means to inform that data processing is being performed, when said second data holding means holds the three values data from said first data processing means.

9. A data processing apparatus comprising:

first data holding means for outputting a signal as three values data representing a first valid value having a first logic value, a second valid value having a second logic value, and an invalid value, said three values data from said first data holding means being a combination of digital data, each changing to two values on two signal lines;

second data holding means for holding the three values data from said first data holding means, said second data holding means including a pair of flip-flops for respectively latching digital data on the two signal lines;

four-input/two-output gate means for receiving a plurality of three values data from said first data holding means and outputting one three values data to said second data holding means;

signal processing means for receiving the three values data from said second data holding means and outputting a first ready signal indicating completion of data processing; and control means for controlling said second data holding means to hold the three values data from said first data holding means, and also outputting a second signal indicating completion of data processing in said second data holding means to said first data holding means when the three values data from said first data holding means exhibits one of the first and second valid values and the first ready signal is input from said signal processing means.

* * * * *